US008786006B2

United States Patent
Forbes et al.

(10) Patent No.: US 8,786,006 B2
(45) Date of Patent: Jul. 22, 2014

(54) FLASH MEMORY DEVICE HAVING A GRADED COMPOSITION, HIGH DIELECTRIC CONSTANT GATE INSULATOR

(75) Inventors: Leonard Forbes, Corvallis, OR (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 55 days.

(21) Appl. No.: 13/595,219

(22) Filed: Aug. 27, 2012

(65) Prior Publication Data

US 2012/0313097 A1    Dec. 13, 2012

Related U.S. Application Data

(60) Division of application No. 13/023,609, filed on Feb. 9, 2011, now Pat. No. 8,258,518, which is a continuation of application No. 11/811,609, filed on Jun. 11, 2007, now Pat. No. 7,892,921, which is a division of application No. 11/114,403, filed on Apr. 26, 2005, now Pat. No. 7,253,469.

(51) Int. Cl.
*H01L 29/78* (2006.01)
*H01L 27/115* (2006.01)
*H01L 21/8239* (2006.01)

(52) U.S. Cl.
CPC ....... *H01L 27/11517* (2013.01); *H01L 21/8239* (2013.01); *H01L 27/11563* (2013.01)
USPC ............ 257/325; 257/E21.688; 257/E29.129; 257/E21.687

(58) Field of Classification Search
None
See application file for complete search history.

(56) References Cited

U.S. PATENT DOCUMENTS

| | | | |
|---|---|---|---|
| 5,731,045 A | 3/1998 | Dearnaley et al. | |
| 5,770,501 A | 6/1998 | Hong | |
| 6,335,238 B1 | 1/2002 | Hanttangady et al. | |
| 6,511,872 B1 | 1/2003 | Donnelly, Jr. et al. | |
| 6,586,797 B2 | 7/2003 | Forbes et al. | |
| 6,794,255 B1 | 9/2004 | Forbes et al. | |
| 2002/0025626 A1 | 2/2002 | Hattangady et al. | |
| 2003/0042527 A1 | 3/2003 | Forbes et al. | |
| 2003/0048666 A1 | 3/2003 | Eldridge et al. | |
| 2003/0049900 A1 | 3/2003 | Forbes et al. | |
| 2003/0193062 A1 | 10/2003 | Jong et al. | |
| 2004/0262699 A1 | 12/2004 | Rios et al. | |
| 2006/0043463 A1 | 3/2006 | Liu et al. | |

OTHER PUBLICATIONS

Liu et al., *Structure and properties of germanium carbide films prepared by RF reactive sputtering in Ar/CH/sub 4/.*, Japanese Journal of Applied Physics Part 1 vol. 36, No. 6A, Jun. 1997, pp. 3625-3628.

(Continued)

*Primary Examiner* — Julio J Maldonado
*Assistant Examiner* — Mohammad Choudhry
(74) *Attorney, Agent, or Firm* — Dicke, Billig & Czaja, PLLC (57) ABSTRACT

A graded composition, high dielectric constant gate insulator is formed between a substrate and floating gate in a flash memory cell transistor. The gate insulator comprises amorphous germanium or a graded composition of germanium carbide and silicon carbide. If the composition of the gate insulator is closer to silicon carbide near the substrate, the electron barrier for hot electron injection will be lower. If the gate insulator is closer to the silicon carbide near the floating gate, the tunnel barrier can be lower at the floating gate.

21 Claims, 6 Drawing Sheets

(56) References Cited

OTHER PUBLICATIONS

Gong et al., *Asymmetric electron spin resonance signals in hydrogenated amorphous germanium carbide films*, Physica Status Solidi B (Germany) vol. 172 No. 1, Jul. 1992, pp. K1-5.

Kumru, M., *A comparison of the optical, IR, electron spin resonance and conductivity properties of a Ge/subl-x/C/subx/:H with a Ge:H and a Ge thin films prepared by RF sputtering*, Thin Solid Films (Switzerland), vol. 198, No. 1-2, Mar. 1991, pp. 75-84.

Kelly et al., *Application of germanium carbide in durable multiplaver IR coatings.*, Hard Materials in Optics, The Hague, Netherlands, Mar. 14-15, 1990.

Booth et al., *The optical and structural properties of CVD germanium carbide.*, Journal de Physique Colloque (France), vol. 42, No. C-4, pt.2, Oct. 1981, pp. 1033-1036.

P. Pavan et al., *Flash Memory Cells—An Overview*, Proceedings of the IEEE, vol. 85, No. 8, Aug. 1997, pp. 1248-1271.

M. Vetter et al., *IR—study of a SiC/sub x/:H and a-SiC/sub x/N/sub y/:H films for c-Si surface passivation*, Thin Solid Films, vol. 451-452, Mar. 22, 2004, pp. 340-344.

A.H. Mahan et al., *On the influence of short and medium range order on the material band gap in hydrogenated amorphous silicon*, Journal of Applied Physics, vol. 96, No. 7, Oct. 2004, pp. 3818-3826.

C. Summonte et al., *Wide band-gap silicon-carbon alloys deposited by very high frequency plasma enhanced chemical vapor deposition*, Journal of Applied Physics, vol. 96 No. 7, Oct. 2004, pp. 3987-3997.

J. Tyczkowski et al., *Electronic band structure of insulating hydrogenated carbon-germanium films*, Journal of Applied Physics, vol. 86, No. 8, Oct. 1999, pp. 4412-4418.

R. Shinar et al., *Electron energy-loss studies on radio frequency sputtered a-$Ge_{1-x}C_x$: H films*, Journal Vac. Sci. Technology A, vol. 5, No. 5, Sep./Oct. 1987, pp. 2804-2808.

R. Shinar, Hydrogen adsorption on some a-$Ge_{1-x}C_x$:H films prepared by radio frequency sputtering, Journal Vac. Sci. Technology A, vol. 6, No. 5, Sep./Oct. 1988, pp. 2910-2913.

L. Vikram et al., Microcrystalline Germanium Carbide—A new material for PV conversion, Iowa State University, Dept. of Electrical and Computer Engr., Ames, Iowa, pp. 348-349.

FLASH MEMORY DEVICE HAVING A GRADED COMPOSITION, HIGH DIELECTRIC CONSTANT GATE INSULATOR

RELATED APPLICATION

This application is a Divisional of U.S. application Ser. No. 13/023,609 titled "FLASH MEMORY DEVICE HAVING A GRADED COMPOSITION, HIGH DIELECTRIC CONSTANT GATE INSULATOR", filed Feb. 9, 2011 (now U.S. Pat. No. 8,258,518) that is a Continuation of U.S. application Ser. No. 11/811,609 titled "FLASH MEMORY DEVICE HAVING A GRADED COMPOSITION, HIGH DIELECTRIC CONSTANT GATE INSULATOR", filed Jun. 11, 2007 (now U.S. Pat. No. 7,892,921) that is a Divisional of U.S. application Ser. No. 11/114,403 titled "FLASH MEMORY DEVICE HAVING A GRADED COMPOSITION, HIGH DIELECTRIC CONSTANT GATE INSULATOR" filed Apr. 26, 2005 (now U.S. Pat. No. 7,253,469) which is commonly assigned and incorporated herein by reference.

TECHNICAL FIELD

The present invention relates generally to memory devices and in particular the present invention relates to flash memory devices with graded composition gate insulators.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Program code and system data such as a basic input/output system (BIOS) are typically stored in flash memory devices for use in personal computer systems.

Flash memory cells are typically comprised of field effect transistors (FET) with floating gates. The gates are referred to as floating since they are electrically isolated from other conductive areas of the transistor by layers of oxide insulation. The floating gate can be programmed or erased by Fowler-Nordheim tunneling in which electrons tunnel through a barrier in the presence of a high electric field in the oxide.

One drawback with floating gate FETs is the relatively large amount of time needed to store a charge on the floating gate during a write operation and the relatively large amount of time necessary to remove the charge during an erase operation. One reason for the high time requirements is the relatively large tunneling barrier between the silicon substrate and the silicon dioxide insulator. Additionally, the high electric field required to cause electron injection in order to tunnel through the barrier typically contributes to reliability problems and premature gate insulator breakdowns.

Figure 1:
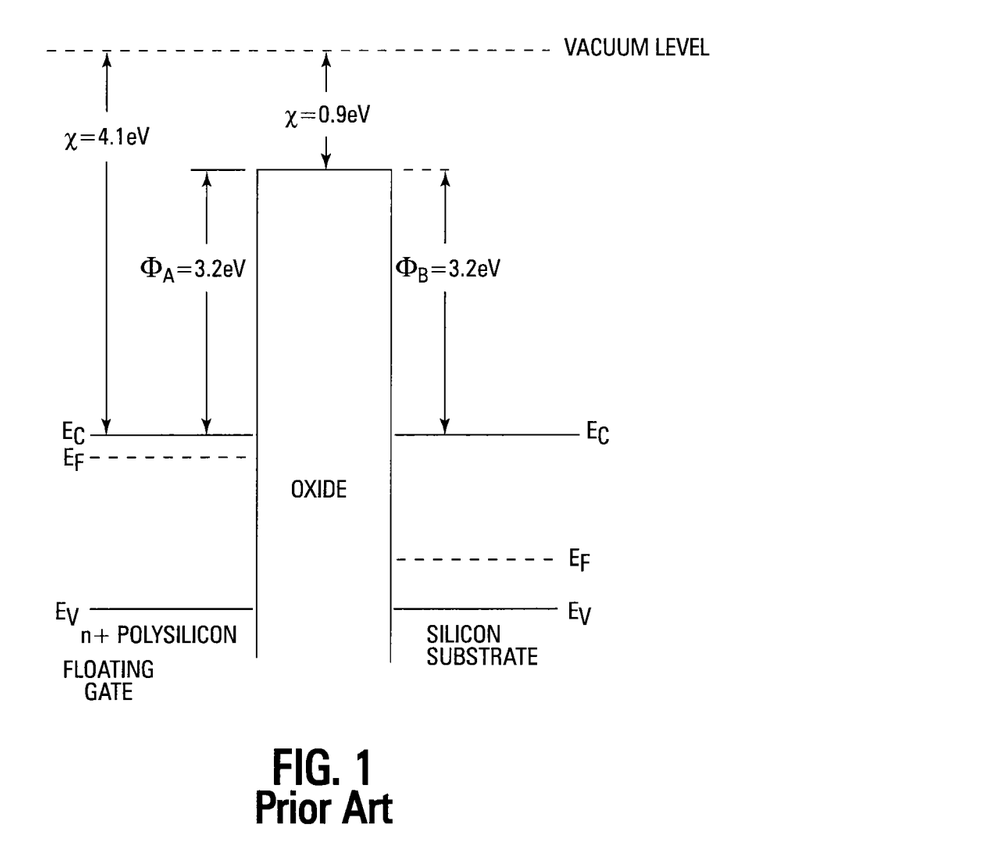
FIG. 1 shows a typical prior art electron energy diagram for a flash memory cell.

As a typical prior art example, silicon dioxide ($SiO_2$) is an insulator with a relative dielectric constant of 3.9, an energy gap of approximately $E_g$=9 eV, and electron affinity of $\chi$=0.9 eV. By comparison, the energy gap and electron affinity for the semiconductor silicon are $E_g$=1.1 eV and $\chi$=4.1 eV, respectively. In a conventional flash memory cell, electrons stored on the polysilicon floating gate see a large tunneling barrier of about 3.2 eV. FIG. 1 illustrates the typical prior art large barrier, $\Phi$=3.2 eV, for tunneling erase in flash memory devices. The large tunneling barrier $\Phi$=3.2 eV is the difference between the electron affinities of silicon (i.e., $\chi$=4.1 eV) and $SiO_2$ (i.e., $\chi$=0.9 eV). This is a relatively large barrier that requires a high applied electric field.

There is a resulting need in the art for an improved gate insulator that provides a low tunneling barrier in order to decrease the time required for programming and erase operations in a flash memory cell.

DETAILED DESCRIPTION

In the following detailed description of the invention, reference is made to the accompanying drawings that form a part hereof and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The following detailed description is, therefore, not to be taken in a limiting sense, and the scope of the present invention is defined only by the appended claims and equivalents thereof The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions.

Figure 2:
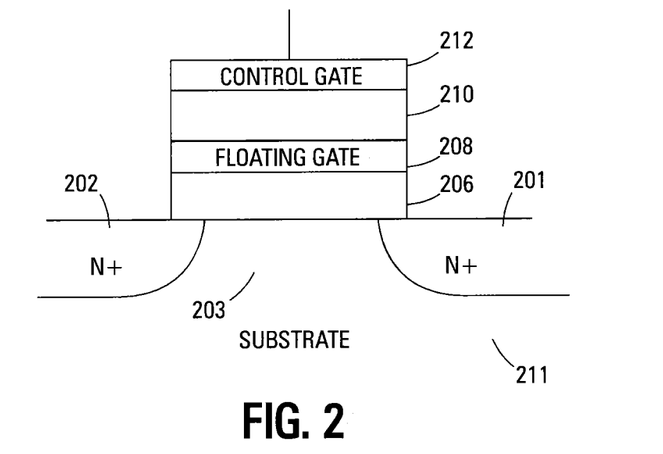
FIG. 2 shows a cross-sectional view of one embodiment of a flash memory cell transistor of the present invention having a graded composition, high dielectric constant gate insulator.

FIG. 2 illustrates a cross-sectional view of one embodiment of a flash memory cell transistor of the present invention. The transistor has a graded composition, high dielectric constant (i.e., high-K) gate dielectric. The transistor comprises a pair of source/drain regions 201 and 202 implanted in a silicon substrate 211. The direction of operation of the transistor determines which region 201 or 202 functions as a source and which functions as a drain. A channel region 203 exists between the source/drain regions 201 and 202. In an alternate embodiment, the substrate 211 comprises germanium.

In one embodiment, the source/drain regions 201 and 202 are n+ doped regions in a p+ type substrate 211. An alternate embodiment may use p+ doped source/drain regions in an n+ type substrate. The present invention is not limited to any one conductivity type for the source/drain regions or the substrate.

A high-permittivity (high-K), graded composition tunnel gate dielectric 206 is formed over the substrate 211 substantially between the source/drain regions 201 and 202 and over the channel region 203. As discussed subsequently, the tunnel gate dielectric 206 is amorphous germanium carbide or graded composition amorphous germanium-silicon carbide that provide adjustable barrier heights in contact with the substrate 211 and floating gate layer 208.

A floating gate layer 208 is formed over the tunnel gate dielectric layer 206. A gate insulator layer 210 is formed over the floating gate 208. A control gate 212 is formed on top of the gate insulator layer 210. In one embodiment, the floating gate layer 208 and the control gate 212 are a polysilicon material and the gate insulator layer 210 is an interpoly insulator.

The architecture of the flash memory cell transistor of FIG. 2 is for purposes of illustration only. The amorphous germanium carbide and graded composition amorphous germanium-silicon carbide tunnel dielectric of the present invention is not limited to planar transistors as illustrated in FIG. 2. This type of tunnel dielectric can be used in other types of planar transistors as well as vertical transistors.

In one embodiment, a high dielectric constant is considered to be a dielectric constant that is greater than that of $SiO_2$. A wide variety of different high dielectric constant insulators can be realized using atomic layer deposition (ALD) or evaporation techniques. An example of such dielectric materials and their characteristics are summarized in the following table:

| Material | Dielectric Constant (K) | Band Gap $E_c$ (eV) | Delta $E_c$ (eV) to Si |
|---|---|---|---|
| $SiO_2$ | 3.9 | 8.9 | 3.2 |
| $Si_3N_4$ | 7 | 5.1 | 2 |
| $Al_2O_3$ | 9 | 8.7 | 2.8 |
| $Y_2O_3$ | 15 | 5.6 | 2.3 |
| $La_2O_3$ | 30 | 4.3 | 2.3 |
| $Ta_2O_5$ | 26 | 4.5 | 1-1.5 |
| $TiO_2$ | 80 | 3.5 | 1.2 |
| $HfO_2$ | 25 | 5.7 | 1.5 |
| $ZrO_2$ | 25 | 7.8 | 1.4 |
| SiC | 10 | 3.4 | 1.1 |
| $Ge_XC_Y$ | 12 (est.) | 5.7 | 2.2 |

Alternate embodiments use other dielectrics than those listed above that have other dielectric constants. The characteristics of these materials are well known to those skilled in the art and are not discussed further.

The high-K dielectric materials of the present invention can be used as graded composition in either the tunnel gate dielectric 206 or the gate insulator layer 210. By varying the composition ratios of these high-K dielectrics, the barriers and/or tunnel barriers can either be reduced between the silicon and the gate dielectric as illustrated in FIG. 3 or between the floating gate and the gate insulating dielectric as illustrated in FIG. 4.

Figure 3:
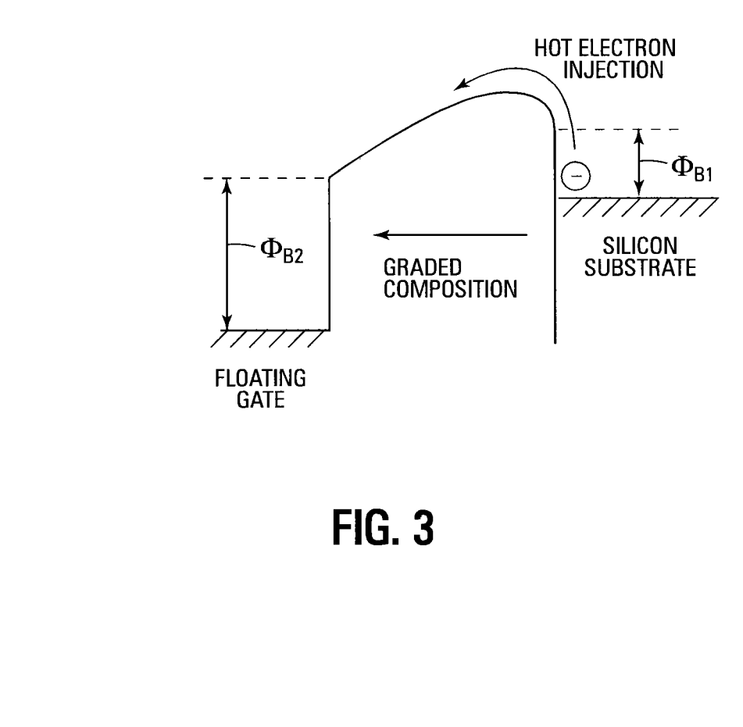
FIG. 3 shows one embodiment of an electron energy band diagram in accordance with the graded composition, high dielectric constant gate insulator transistor structure of FIG. 2.
Figure 4:
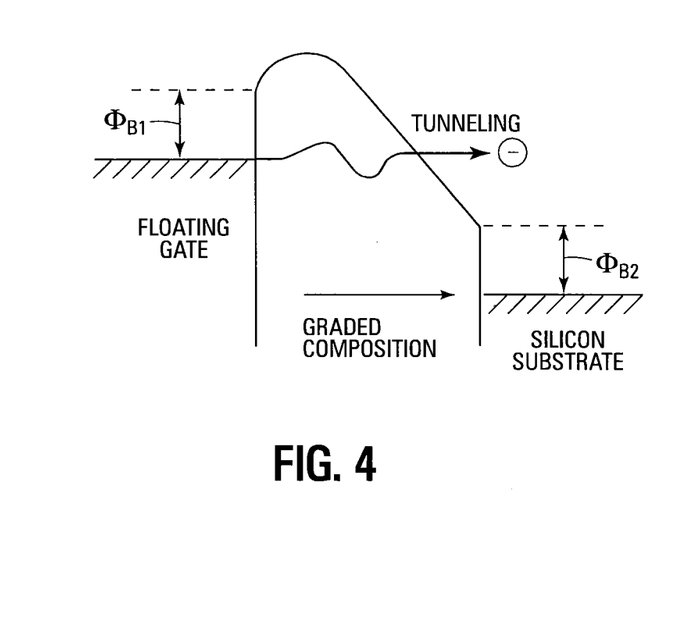
FIG. 4 shows an electron energy band diagram in accordance with another embodiment of the graded composition, high dielectric constant gate insulator transistor structure of FIG. 2.

FIG. 3 illustrates an electron energy band diagram in accordance with the graded composition, high dielectric constant gate insulator transistor structure of FIG. 2. The graded composition, in one embodiment, is silicon carbide to germanium carbide that is graded in the direction shown from silicon carbide closest to the silicon substrate to germanium carbide closest to the polysilicon floating gate. By making the insulator composition close to silicon carbide at the substrate, the electron barrier for hot electron injection will be reduced from the prior art. Also, the tunnel barrier from the floating gate can be kept higher by making the insulator composition close to germanium carbide at the floating gate.

This composition could be deposited on a silicon carbide gate insulator formed by carburization of silicon. Alternate embodiments could use other techniques for the deposition of silicon carbide and germanium carbide.

An alternate embodiment uses a graded composition of silicon oxide to silicon carbide to germanium carbide. As illustrated in FIG. 3, the tunnel gate insulator is graded from silicon oxide nearest the substrate to silicon carbide to germanium carbide nearest the floating gate.

In still another embodiment, the gate insulator comprises amorphous germanium carbide. As seen in the table above and the plot of FIG. 5, this composition also provides a lower band gap and larger electron affinity than prior art materials such as $SiO_2$.

FIG. 4 illustrates an electron energy band diagram in accordance with another embodiment of the graded composition, high dielectric constant gate insulator transistor structure of FIG. 2. The graded composition, in one embodiment, is silicon carbide to germanium carbide. The gate insulator is graded in the direction shown from silicon carbide nearest the polysilicon floating gate to germanium carbide nearest the silicon substrate. FIG. 4 shows that this graded composition results in a low barrier at the polysilicon floating gate-gate insulator interface.

In one embodiment, the germanium carbide is deposited on the silicon substrate or a thin layer of silicon oxide and the composition graded towards silicon carbide as the tunnel gate insulator is further deposited. Alternate embodiments can use other techniques for forming this layer.

In another embodiment, the tunnel gate insulator comprises a graded composition of silicon oxide to silicon carbide to germanium carbide. As indicated in the figure, the silicon oxide is formed closest to the floating gate while the germanium carbide is formed closest to the silicon substrate.

Figure 5:
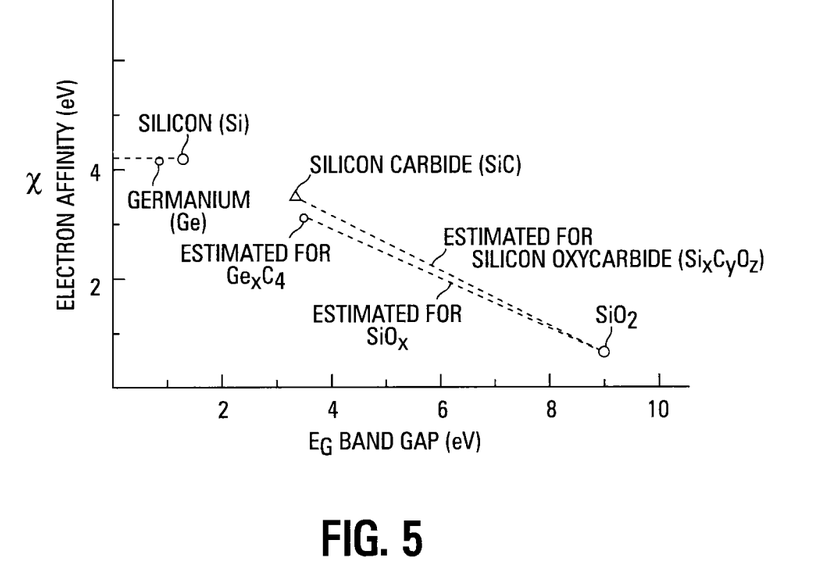
FIG. 5 shows a plot of band gap energies versus electron affinities in accordance with the embodiments of the present invention.

FIG. 5 illustrates a plot of electron affinity versus band gap energy of silicon, silicon carbide (SiC), Germanium, and Germanium Carbide ($Ge_XC_Y$). As shown in this plot, prior art insulator silicon dioxide has a relative dielectric constant of 3.9, energy gap of approximately 9.0 eV, and electron affinity of 0.9 eV. In a conventional flash memory, electrons stored on the polysilicon floating gate see a large tunneling barrier of about 3.2 eV. This value is the difference between the electron affinities of silicon (4.1 eV) and $SiO_2$ (0.9 eV). This is a relatively large barrier that requires high applied electric fields for electron injection.

The plot also shows that SiC has a band gap of 3 eV and an electron affinity of 3.7 eV. Amorphous SiC has relatively low conductivity under modest applied electric fields. Similarly, $Ge_xC_y$ has an estimated band gap of 2.5 eV and an electron affinity of 3.0 eV. Both have a much larger electron affinity and a much smaller barrier than $SiO_2$ that requires a much lower applied electric field for electron injection.

Figure 6:
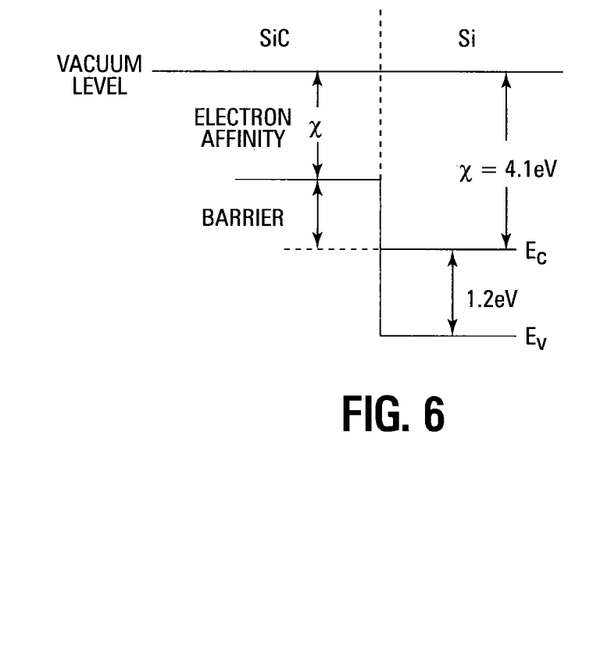
FIG. 6 shows a band diagram for amorphous silicon carbide on silicon in accordance with the embodiments of the present invention.

FIG. 6 illustrates a band diagram for amorphous silicon carbide on silicon in accordance with the embodiments of the present invention. If amorphous hydrogenated silicon carbide is deposited with a gap of up to 3.4 eV, amorphous silicon carbide can then have a band gap of greater than 2.1 eV of crystalline SiC and an electron affinity of less than 3.7 eV. Amorphous silicon carbide on silicon has a low surface recombination velocity and excellent passivation on silicon as compared to the prior art silicon dioxide.

Figure 7:
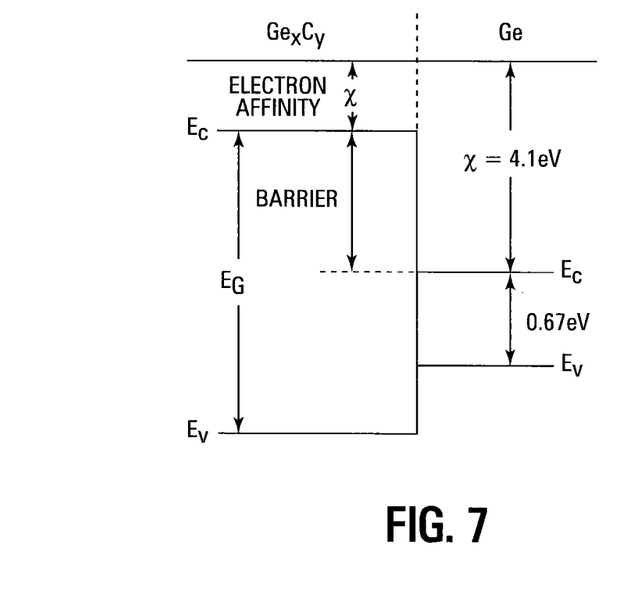
FIG. 7 shows a band diagram for germanium carbide on germanium in accordance with the embodiments of the present invention.

FIG. 7 illustrates a band diagram for germanium carbide on germanium in accordance with the embodiments of the present invention. Microcrystalline hydrogenated germanium carbide films have been deposited by RF sputtering and electron cyclotron resonance plasma processing. With a low carbon concentration of 4%, these have a band gap energy of around that of silicon (i.e., 1.2 eV). Amorphous hydrogenated germanium carbide can be deposited as an insulator and it can have, after annealing, a band gap energy as high as 7.1 eV and an electron affinity of 1.2 eV. Amorphous germanium carbide on germanium can have an energy barrier of up to 2.8 eV and is therefore suitable for passivation and a dielectric insulator.

Figure 8:
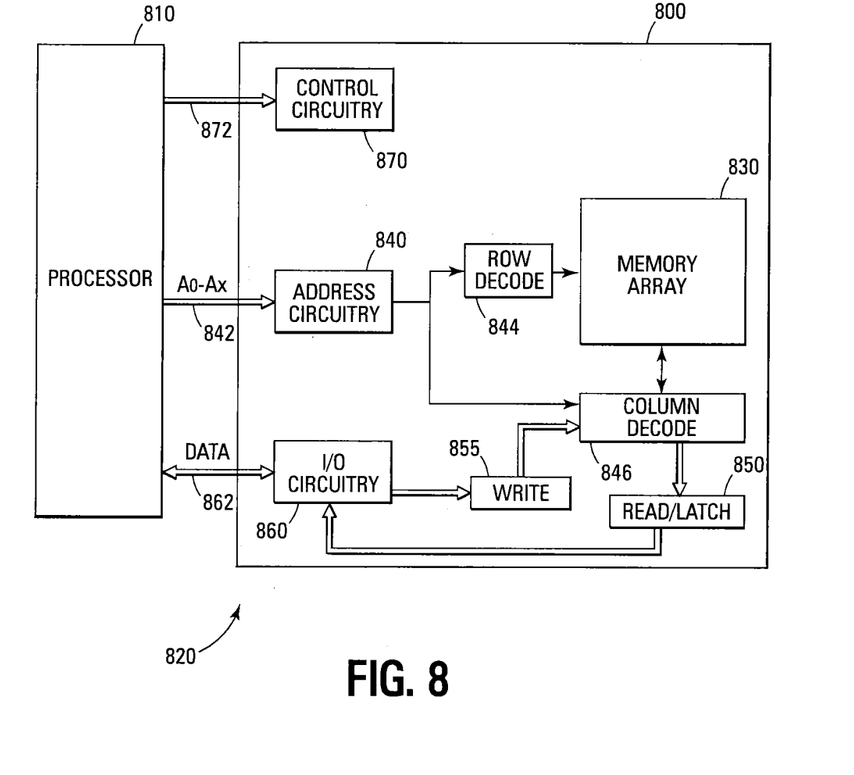
FIG. 8 shows a block diagram of an electronic system of the present invention.

FIG. 8 illustrates a functional block diagram of a memory device 800 that can incorporate the flash memory cells of the present invention. The memory device 800 is coupled to a processor 810. The processor 810 may be a microprocessor or some other type of controlling circuitry. The memory device 800 and the processor 810 form part of an electronic system 820. The memory device 800 has been simplified to focus on features of the memory that are helpful in understanding the present invention.

The memory device includes an array of flash memory cells 830. The memory array 830 is arranged in banks of rows and columns. The control gates of each row of memory cells is coupled with a wordline while the drain and source connections of the memory cells are coupled to bitlines. As is well known in the art, the connection of the cells to the bitlines depends on whether the array is a NAND architecture, a NOR architecture, or some other array architecture. The flash memory cells of the present invention are not limited to any one architecture.

An address buffer circuit 840 is provided to latch address signals provided on address input connections A0-Ax 842. Address signals are received and decoded by a row decoder 844 and a column decoder 846 to access the memory array 830. It will be appreciated by those skilled in the art, with the benefit of the present description, that the number of address input connections depends on the density and architecture of the memory array 830. That is, the number of addresses increases with both increased memory cell counts and increased bank and block counts.

The memory device 800 reads data in the memory array 830 by sensing voltage or current changes in the memory array columns using sense/buffer circuitry 850. The sense/buffer circuitry, in one embodiment, is coupled to read and latch a row of data from the memory array 830. Data input and output buffer circuitry 860 is included for bi-directional data communication over a plurality of data connections 862 with the controller 810). Write circuitry 855 is provided to write data to the memory array.

Control circuitry 870 decodes signals provided on control connections 872 from the processor 810. These signals are used to control the operations on the memory array 830, including data read, data write, and erase operations. The control circuitry 870 may be a state machine, a sequencer, or some other type of controller.

The flash memory device illustrated in FIG. 8 has been simplified to facilitate a basic understanding of the features of the memory. A more detailed understanding of internal circuitry and functions of flash memories are known to those skilled in the art.

CONCLUSION

In summary, flash memory transistors of the present invention with graded composition, high-K gate dielectrics reduce the electron barrier between the substrate and gate insulator and the tunnel barrier between the polysilicon floating gate and gate insulator. This is accomplished by using a graded composition, high-K dielectric gate insulator instead of the prior art's silicon dioxide.

The use of the gate insulators described above allows for two different barriers. The lower height of the tunneling barriers with high-K dielectric gate insulators can provide larger tunneling currents out of the floating gate with smaller control gate voltages. The lower barrier at the interface with the silicon substrate makes the write operation easier and write currents by channel hot electron injection larger at lower voltages. Both tunneling currents and hot electron injection currents are exponential functions of the barrier heights and electric fields.

The higher dielectric constant gate insulators of the present invention also allow for better scaling of flash memory devices to smaller dimensions. The effective gate length of high-K gate tunneling dielectric flash memory transistors can be scaled below 50 nm. High-k gate dielectrics reduce or eliminate drain turn-on problems, short-channel effects and punchthrough in flash memory transistors. Smaller write and erase voltages provide another advantage in that the thickness of the $SiO_2$ or other insulator layer between the control gate and the floating gate can be reduced.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A memory cell, comprising:
   a semiconductor;
   a charge storage structure;
   a control gate;
   amorphous silicon carbide between the semiconductor and the charge storage structure; and
   a graded composition insulator material between the charge storage structure and the control gate.

2. The memory cell of claim 1, wherein the graded composition insulator material comprises pairs of high-permittivity insulating materials taken from a list of materials, the list of materials comprising: $Si_3N_4$, $Al_2O_3$, $Y_2O_3$, $La_2O_3$, $Ta_2O_5$, $TiO_2$, $HfO_2$, $ZrO_2$, SiC and $Ge_xC_y$.

3. The memory cell of claim 1, wherein the memory cell is a vertical memory cell.

4. The memory cell of claim 1, and further including forming a silicon oxide between the semiconductor and the amorphous silicon carbide.

5. The memory cell of claim 2, wherein the high permittivity insulating materials have a dielectric constant greater than 3.9.

6. The memory cell of claim 1, wherein the semiconductor comprises germanium.

7. The memory cell of claim 1, wherein a barrier of the graded composition material is reduced responsive to a composition ratio of the graded composition material.

8. The memory cell of claim 1, further including the amorphous silicon carbide being part of a tunnel insulator that is graded from silicon oxide nearest the semiconductor to silicon carbide to germanium carbide nearest the charge storage structure.

9. The memory cell of claim 1, further including silicon oxide between the amorphous silicon carbide and the semiconductor.

10. The memory cell of claim 1, wherein the memory cell is part of a NAND non-volatile memory array.

11. A memory cell, comprising:
a semiconductor substrate;
a floating gate charge storage structure;
a control gate;
amorphous silicon carbide between the semiconductor substrate and the charge storage structure; and
a graded composition insulator material between the charge storage structure and the control gate.

12. The memory cell of claim 11, wherein the graded composition insulator material comprises a silicon carbide material graded to a germanium carbide material.

13. The memory cell of claim 11, wherein each material of the graded composition insulator material comprises a dielectric material having a dielectric constant greater than $SiO_2$.

14. The memory cell of claim 11, further comprising doped regions formed in the semiconductor substrate, and where the semiconductor substrate comprises a silicon semiconductor substrate.

15. The memory cell of claim 14, wherein the doped regions comprise n+ regions and where the semiconductor substrate comprises a p+ type substrate.

16. The memory cell of claim 14, wherein the doped regions comprise p+ regions and where the semi substrate comprises an n+ type substrate.

17. The memory cell of claim 11, wherein the floating gate and the control gate comprise polysilicon.

18. The memory cell of claim 11, further including the amorphous silicon carbide being part of a tunnel insulator that is graded from silicon oxide nearest the semiconductor to silicon carbide to germanium carbide nearest the charge storage structure.

19. A memory cell, comprising:
a semiconductor substrate;
a floating gate charge storage structure;
a control gate;
a tunnel insulator comprising amorphous silicon carbide and germanium carbide between the semiconductor substrate and the charge storage structure; and
a graded composition insulator material between the charge storage structure and the control gate.

20. The memory cell of claim 19, wherein the graded composition insulator material comprises a graded composition of silicon carbide and germanium carbide.

21. The memory cell of claim 19, wherein the tunnel insulator comprising amorphous silicon carbide and germanium carbide comprises a graded composition of amorphous silicon carbide and germanium carbide.

* * * * *